(12) United States Patent
Yeh et al.

(10) Patent No.: US 7,854,197 B2
(45) Date of Patent: Dec. 21, 2010

(54) METHOD FOR MANUFACTURING PRINTED CIRCUIT BOARDS USING LEGEND PRINTING STENCIL

(75) Inventors: Tso-Hung Yeh, Taoyuan (TW); Hsiao-Chun Huang, Taoyuan (TW); Chun-Ta Huang, Taoyuan (TW); Meng-Hung Wu, Taoyuan (TW)

(73) Assignee: Foxconn Advanced Technology Inc., Tayuan, Taoyuan (TW)

( * ) Notice: Subject to any disclaimer, the term of this patent is extended or adjusted under 35 U.S.C. 154(b) by 580 days.

(21) Appl. No.: 11/940,910

(22) Filed: Nov. 15, 2007

(65) Prior Publication Data

US 2008/0302257 A1    Dec. 11, 2008

(30) Foreign Application Priority Data

Jun. 8, 2007    (CN) .......................... 2007 1 0074779

(51) Int. Cl.
*B41M 1/12*    (2006.01)
(52) U.S. Cl. ........................................ 101/129; 101/127
(58) Field of Classification Search ................. 101/114, 101/123, 124, 127, 127.1, 129
See application file for complete search history.

(56) References Cited

U.S. PATENT DOCUMENTS 5,878,662 A    3/1999    McCue 6,363,847 B1 *    4/2002    Murakami .................. 101/129
6,548,106 B1 *    4/2003    Murakami ................. 427/96.2

FOREIGN PATENT DOCUMENTS

| JP | 2002-164645 A | 6/2002 |
|---|---|---|
| TW | 550173 | 9/2003 |
| TW | 558927 | 10/2003 |

* cited by examiner

*Primary Examiner*—Ren Yan
(74) *Attorney, Agent, or Firm*—Jeffrey T. Knapp

(57) ABSTRACT

An exemplary legend printing stencil for printing a circuit substrate for manufacturing a number of printed circuit board is provided. The stencil includes at least a first printing portion, at least a second printing portion and a junction portion between the first printing portion and the second printing portion. The first printing portion and the second printing portion each define a number of legend holes therein. The first printing portion and the second portion are configured for attaching on and covering the corresponding circuit board unit of the circuit substrate to print legends on the circuit board unit. The junction portion defines a slot therein and is configured for attaching on and covering the corresponding connection portion of the circuit substrate to print a legend ink layer on the connection portion. A method for manufacturing a number of printed circuit boards using the stencil is also provided.

12 Claims, 6 Drawing Sheets

METHOD FOR MANUFACTURING PRINTED CIRCUIT BOARDS USING LEGEND PRINTING STENCIL

BACKGROUND

1. Technical Field

The present invention relates to stencils, and particularly to a legend printing stencil and a method for manufacturing printed circuit boards using the legend printing stencil.

2. Description of Related Art

Printed circuit boards are widely used in electronic products for electrical connection. Printed circuit boards are usually manufactured in a series of processes including drilling holes, facturing electrical traces, printing solder resist, printing legends, electroplating gold and inspecting. Generally, printing legend refers to apply identification nomenclatures (e.g., legends, logos or serialization numbers) to prototypes of printed circuit boards using a legend ink material. Typically, identification nomenclatures are added to prototypes of printed circuit boards using a stencil printing technology.

Correspondingly, a typical large stencil of printing legends having a number of printing portions corresponding to a number of printed circuit boards is used to print legends on the printed circuit boards simultaneously. However, in a process of printing legends, a squeegee only can squeegee one of printing portions to print one of printed circuit boards once. Repeated squeegeeing may cause overlap of the legend ink material at a connection portion of two neighboring printing portions, thereby affecting quality of printing legends.

Additionally, during manufacturing printed circuit boards, a connection portion of two neighboring printed circuit boards has a copper layer thereon. The copper layer is not formed into electrical traces and has no solder resist formed thereon. In an electroplating process, a gold layer may be deposited onto the copper layer of the connection portion. However, the connection portion is generally abandoned after separations of the printed circuit boards. As a result of that, the gold layer deposited on the copper layer of the connection portion becomes waste. If the copper layer of the connection portion is removed before electroplating, the mechanical property and flexibility of the large substrate may be lowered/deteriorated. As such, the manufacturing of a number of printed circuit boards cannot be performed properly, especially using the roll-to-roll process.

What is needed, therefore, is a legend printing stencil that is suitable for manufacturing a number of printed circuit boards, and a method for manufacturing printed circuit boards using the legend printing stencil.

SUMMARY

One present embodiment provides a legend printing stencil for printing legend onto a circuit substrate. The circuit substrate has a first circuit board unit, a second circuit board unit and a connection portion interconnected between the first circuit board unit and the second circuit board unit. The legend printing stencil includes a first printing portion, a second printing portion and a junction portion. The first printing portion defines a number of legend holes therein. The first printing portion is configured for attaching on and covering the first circuit board unit to print legends on the first circuit board unit through the legend holes thereof. The second printing portion defines a number of legend holes therein. The second printing portion is configured for attaching on and covering the second circuit board unit to print legends on the second circuit board unit through the legend holes thereof. The junction portion is interconnected between the first printing portion and the second printing portion. The junction portion defines a slot therein and is configured for attaching on and covering the connection portion to print a legend ink layer on the connection portion through the slot thereof.

Another present embodiment provides a method for manufacturing a number of printed circuit boards. In the method, firstly a circuit substrate is provided. The circuit substrate includes a number of circuit board units and a number of connection portions interconnected between the neighboring circuit board units. Secondly, a legend printing stencil is provided. The legend printing stencil includes a number of printing portions and a number of junction portions interconnected between the neighboring printing portions. Each of the printing portions defines a number of legend holes therein. Each of the junction portions defines a slot therein. Thirdly, the legend printing stencil is disposed on the circuit substrate so that each of the printing portions covers the corresponding circuit board unit and each of the junction portions covers the corresponding connection portion. Fourthly, a legend ink material is applied on the legend printing stencil. Fifthly, the legend printing stencil is removed from the circuit substrate. A number of printing legends are formed on the circuit board units and a legend ink layer is formed on each of the connection portions. Sixthly, the circuit substrate is electroplated with gold. Seventhly, the circuit substrate is separated into a number of individual printed circuit boards.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE EMBODIMENTS

Embodiments will now be described in detail below and with reference to the drawings.

Figure 1:
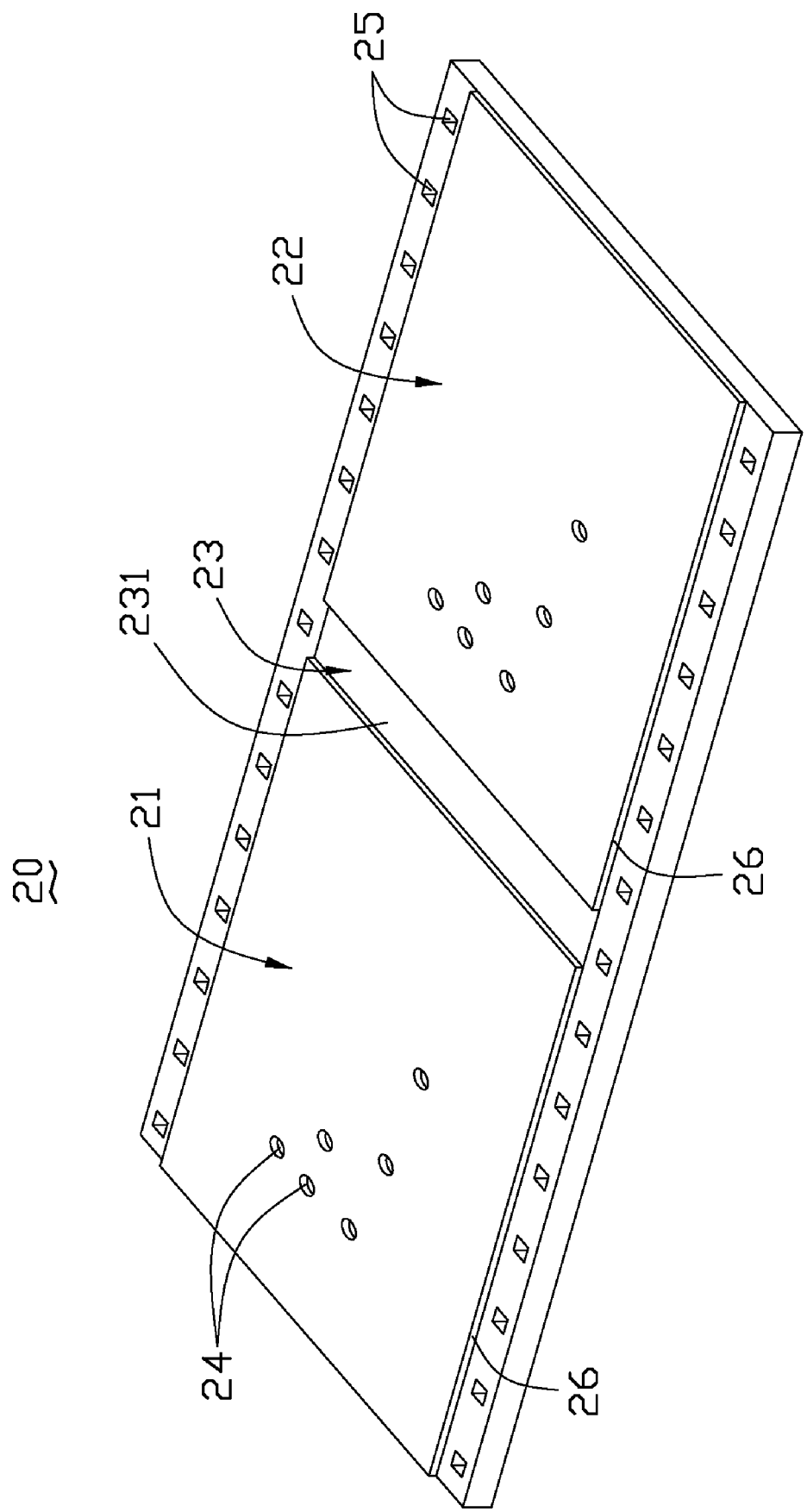
FIG. 1 is a schematic view of a circuit substrate according to a present embodiment.

Referring to FIG. 1, an exemplary circuit substrate 20 is shown. The circuit substrate 20 has undergone a series of processes including drilling holes, facturing electrical traces, printing solder resist, etc, and is ready for printing legends. The circuit substrate 20 includes a number of circuit board units (each circuit board unit will become a single circuit board substrate after separation) and neighboring circuit board units connect with each other via a connection portion.

The circuit board units may be identical to each other. Alternatively, the circuit board units may be different from each other.

In the present embodiment, the circuit substrate 20 is structured and arranged for manufacturing a number of printed circuit boards using a roll-to-roll process. The circuit substrate 20 is a tape-shaped substrate. For purpose of illustration only, two neighboring circuit board units, i.e., first circuit board unit 21 and second circuit board unit 22 are shown in FIG. 1. The first circuit board unit 21 and the second circuit board unit 22 are connected via a connection portion 23 between the first circuit board unit 21 and the second circuit board unit 22. The first circuit board unit 21 and the second circuit board unit 22 each include a conductive pattern (not shown) formed thereon. A solder resist layer 26 is covered on the first circuit board unit 21 and the second circuit board unit 22 configured for protecting the conductive pattern. A number of through holes 24 are defined in the solder resist layer 26 for exposing portions of the conductive pattern, e.g., soldering pads, contact terminals. In order to protect the exposed portions of the conductive pattern from oxidation, a gold layer may be formed on the exposed portions through the through holes 24 using an electroplating deposition process after printing legends.

The connection portion 23 has a metal layer 231 e.g., copper layer, formed thereon. The metal layer 231 connects to the conductive pattern of the first circuit board unit 21 and the second circuit board unit 22.

Additionally, the circuit substrate 20 defines a number of sprocket holes 25 therein, which are disposed at two opposite sides of the circuit substrate 20 along a lengthwise direction of the circuit substrate 20. The circuit substrate 20 can be unwrapped from an unwrapping roller (not shown) and be rewrapped on a rewrapping roller (not shown) using the sprocket holes 25.

It is noted that the circuit substrate 20 also can be in a sheet-shaped so as to manufacture a number of printed circuit boards using a sheet-by-sheet process.

Figure 2:
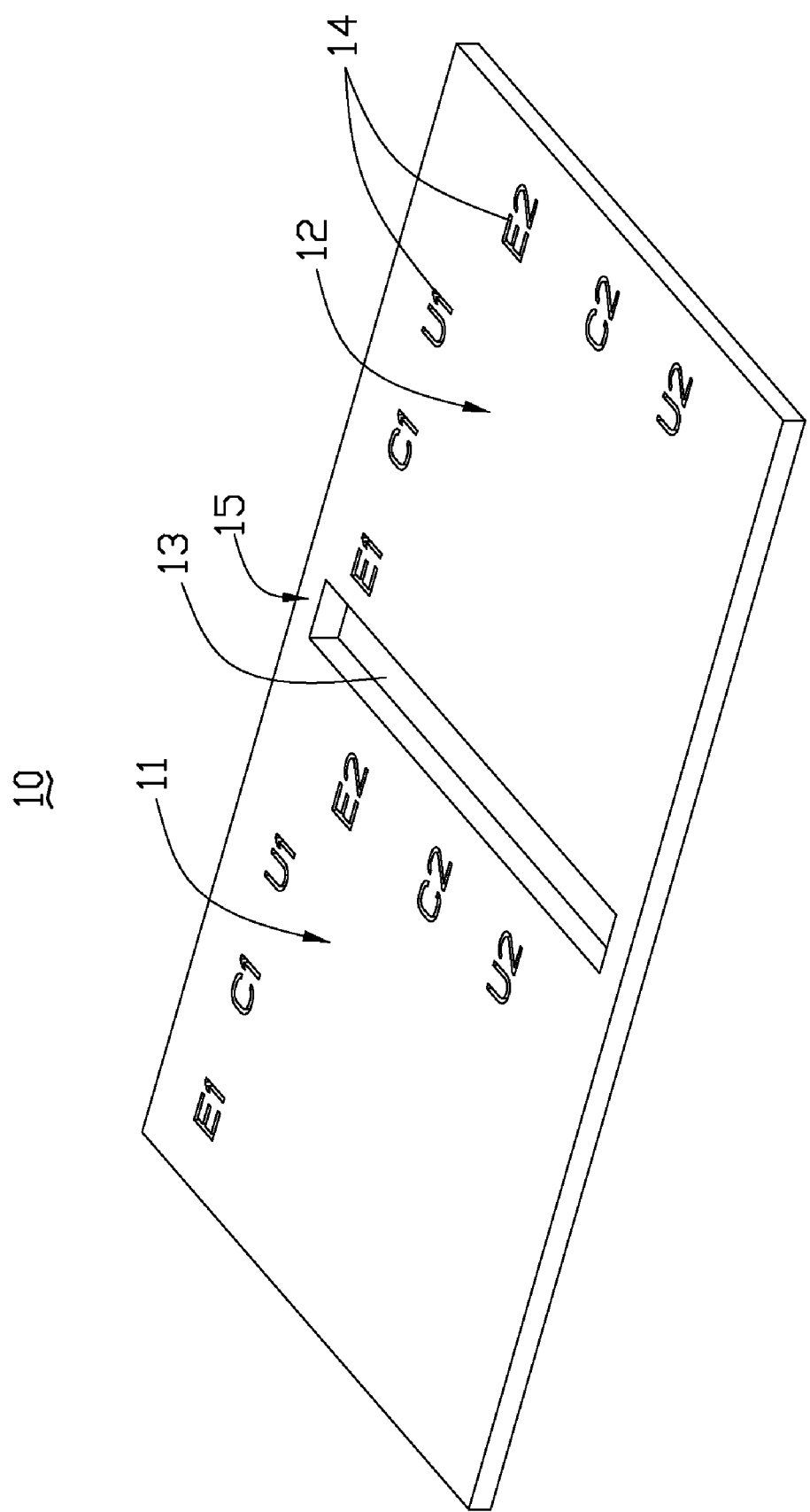
FIG. 2 is a schematic view of a legend printing stencil according to the present embodiment.

Referring to FIG. 2, a legend printing stencil 10 for printing legends on the circuit substrate 20 is shown. The legend printing stencil 10 is comprised of a material selected from a group consisting of metal, wood and plastic. The legend printing stencil 10 is designed to mate with the circuit substrate 20. In the present embodiment, the legend printing stencil 10 is a tape-shaped and includes a first printing portion 11, a second printing portion 12 and a junction portion 15 interconnected between the first printing portion 11 and the second printing portion 12. The first printing portion 11 mates with the first circuit board unit 21 of the circuit substrate 20 and is configured for attaching on and covering the first circuit board unit 21 to print legends on the first circuit board unit 21. The second printing portion 12 mates with the second circuit board unit 22 of the circuit substrate 20 and is configured for attaching on and covering the second circuit board unit 22 to print legend on the second circuit board unit 22. Similarly, the first printing portion 11 and the second printing portion 12 have an identical configuration. The junction portion 15 mates with the connection portion 23 of the circuit substrate 20 and is configured for attaching on and covering the connection portion 23 to print a legend ink layer on the connection portion 23.

The first printing portion 11 and the second printing portion 12 defines a number of legend holes 14 therein. The legend holes 14 have through-hole structures with desired shape. The legend holes 14 may have a shape of characters, logos, serialization numbers or any combination of characters, logos, and serialization numbers.

The junction portion 15 defines a slot 13 therein. The slot 13 can be in various configurations according to demand. In the present embodiment, the slot 13 is in a rectangular shape. The slot 13 extends perpendicularly to a lengthwise direction of the legend printing stencil 10. The slot 13 in the junction portion 15 is configured for printing a legend ink material on the metal layer 231 of the connection portion 23.

Many advantages of using the legend printing stencil 10 in a process of manufacturing a number of printed circuit boards can be described. Firstly, the legend printing stencil 10 can avoid overlap of the legend ink material printed on the first circuit board unit 21 and on the second circuit board unit 22, thereby improving quality of printing legends. Secondly, the circuit substrate 20 printed legends using the legend printing stencil 10 have the legend ink layer on the connection portion 23 so as to protect the connection portion 23 from electroplating, thereby decreasing cost of manufacturing a number of printed circuit boards.

Referring to FIGS. 3 to 6, an exemplary method for manufacturing a number of printed circuit boards using the legend printing stencil 10 includes the following steps.

Step 1: the circuit substrate 20, as described above, is provided.

Step 2: the legend printing stencil 10, as described above, is provided.

Step 3: the legend printing stencil 10 is disposed on the circuit substrate 20.

Figure 3:
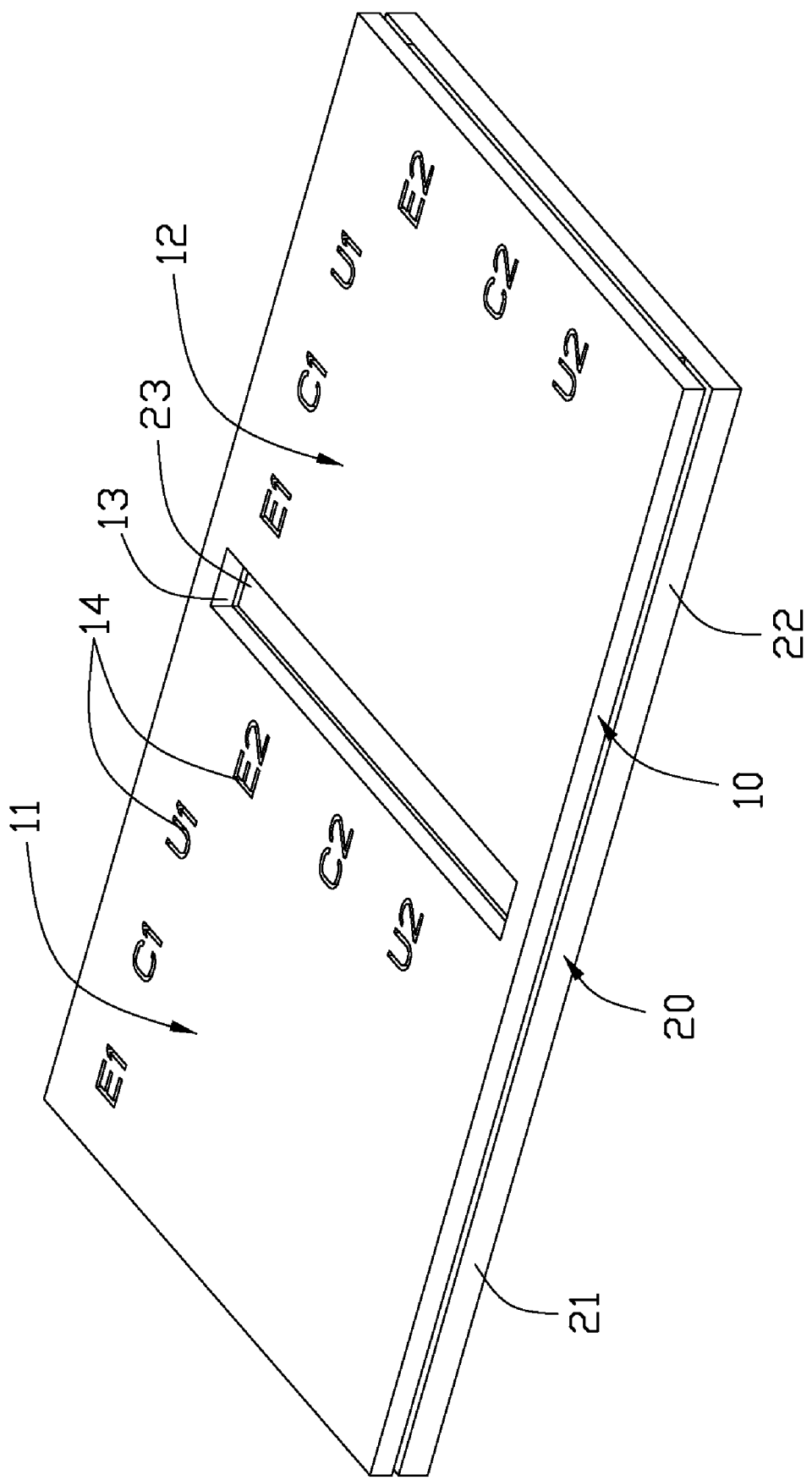
FIG. 3 is a schematic view of a circuit substrate having a legend printing stencil disposed thereon.
Figure 4:
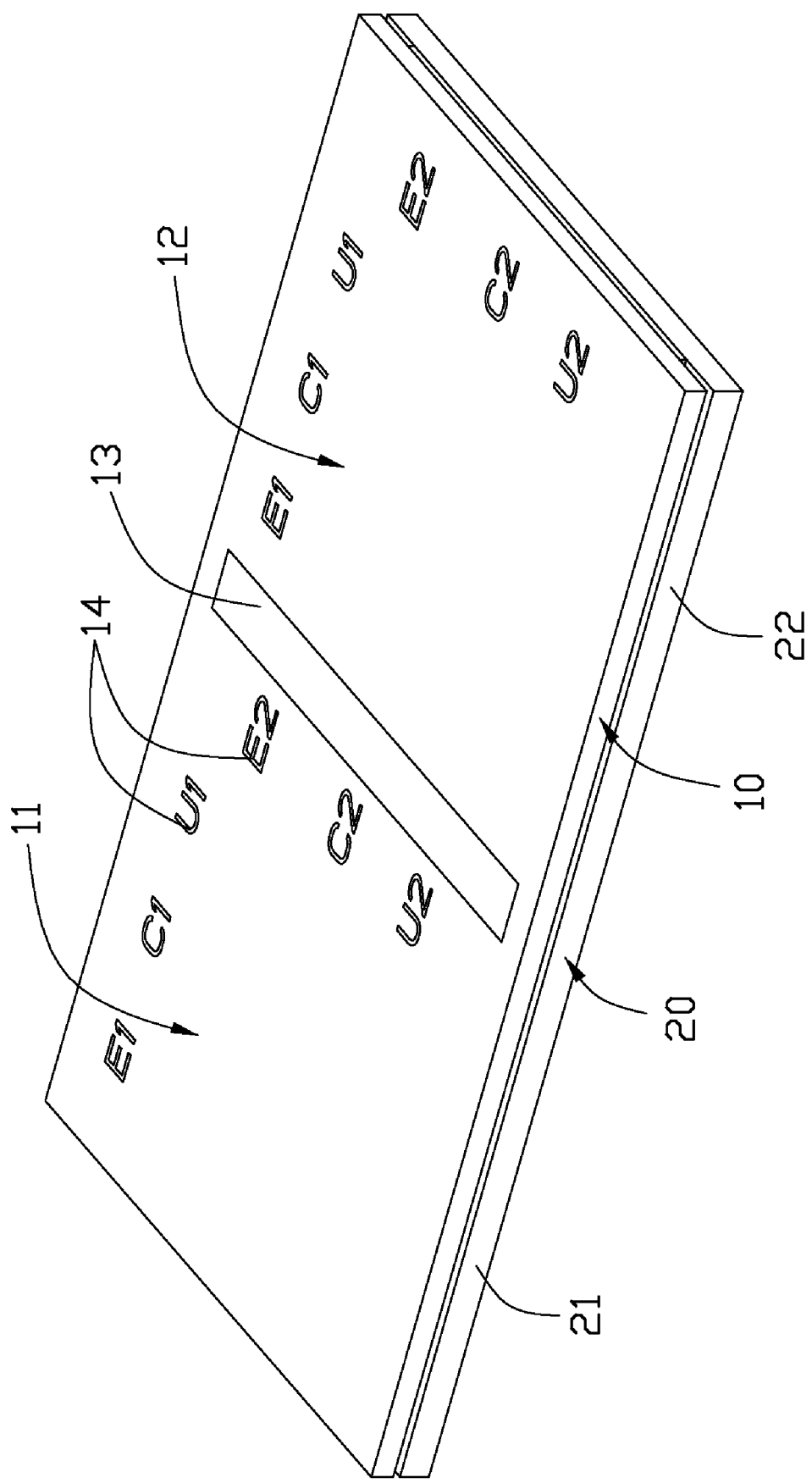
FIG. 4 is a schematic view of the circuit substrate having the legend printing stencil disposed thereon, which is printed with a legend ink material.

Referring to FIG. 3, the legend printing stencil 10 is disposed on the circuit substrate 20. The first printing portion 11 is attached on and covers the first circuit board unit 21 of the circuit substrate 20 and is configured for printing legends on the solder resist layer 26 of the first circuit board unit 21 through the legend holes 14. The second printing portion 12 is attached on and covers the second circuit board unit 22 of the circuit substrate 20 and is configured for printing legends on the solder resist layer 26 of the second circuit board unit 22 through the legend holes 14. The junction portion 15 is attached on and covers the connection portion 23 of the circuit substrate 20 and is configured for printing a legend ink layer on the connection portion 23 through the slot 13.

Step 4: a legend ink material is applied on the legend printing stencil 10.

In the process of printing legends using the legend printing stencil 10, the legend ink material is applied on the legend printing stencil 10 using a method selected from a group consisting of spraying coating, brushing coating and roller coating. The legend ink material will pass through the legend holes 14 and the slot 13 of the legend printing stencil 10. As a result, referring to FIG. 4, the legend holes 14 and the slot 13 can be filled with the legend ink material.

Generally, the legend ink material can be selected from a group consisting of a thermally curable legend ink and an ultraviolet curable legend ink. After applying the legend ink material, a process of curing the legend ink material is performed. In the present embodiment, the legend ink material is a thermally curable legend ink. The thermally curable legend ink can have a main thermally curable resin composition such as epoxy resin, amino resin and polymethyl methacrylate resin. Therefore, the legend ink material applied can be cured under a certain thermally condition.

Step 5: the legend printing stencil 10 is removed from the circuit substrate 20.

Figure 5:
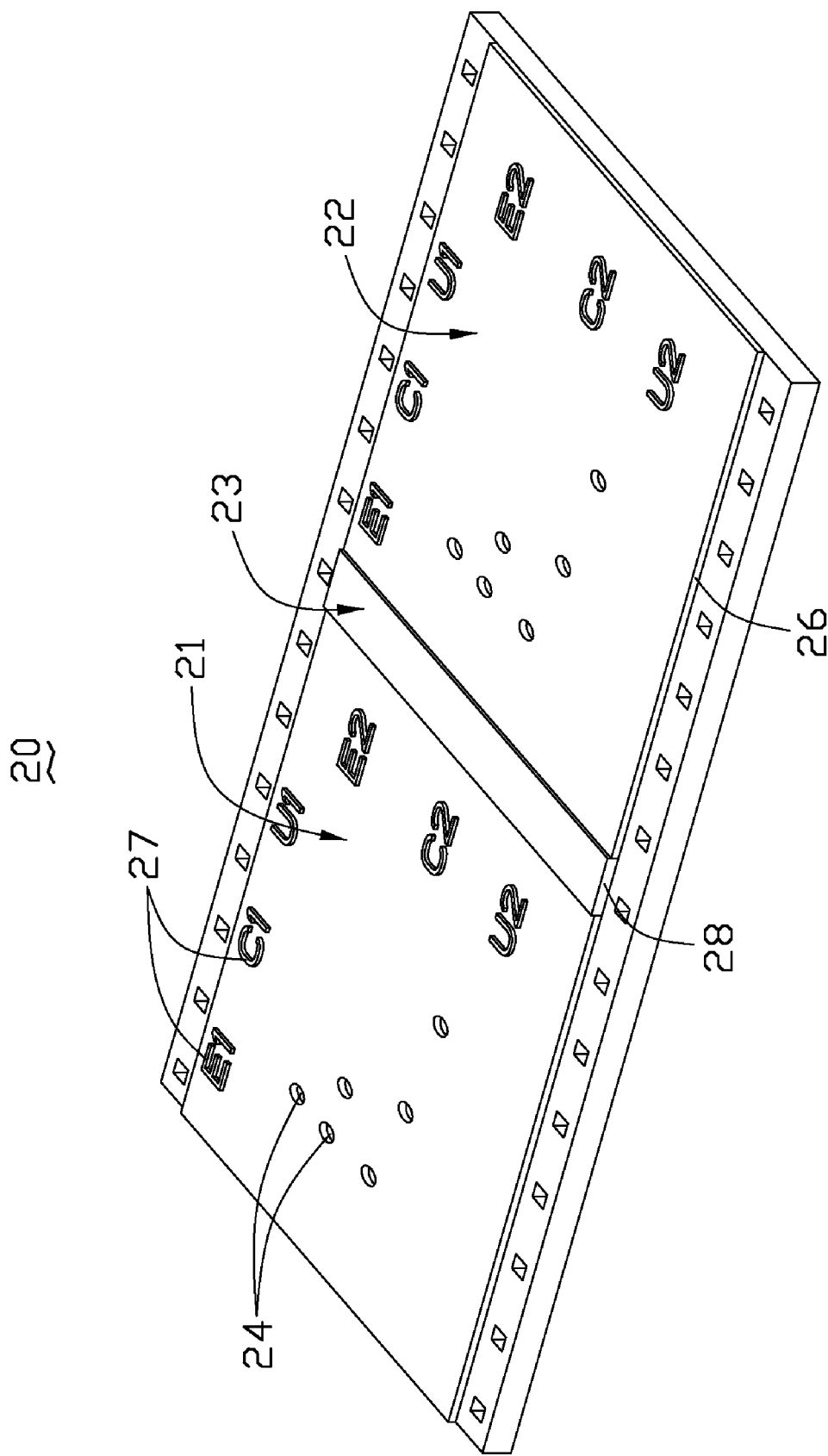
FIG. 5 is a schematic view of the circuit substrate printed legend thereon.

Referring to FIG. 5, the legend printing stencil 10 is removed from the circuit substrate 20 after the legend ink material is applied on the legend printing stencil 10. As a result, the printing legends 27 are respectively formed on the solder resist layer 26 of the first circuit board unit 21 and the second circuit board unit 22 of the circuit substrate 20. Simultaneously, a legend ink layer 28 is formed on the metal layer 231 of the connection portion 23 of the circuit substrate 20.

Step 6: the circuit substrate 20 is electroplated with gold.

After printing legends, appearances of the circuit substrate 20 are checked for irregularities. When the appearances of the circuit substrate 20 are regular, a step of electroplating can be performed. The exposing portions of the conductive pattern from the solder resist layer 26, e.g., soldering pads, contact terminals on the circuit substrate 20 can electroplate a gold layer thereon so as to improve reliability of the soldering pads and the contact terminals and provide them with a protection against oxidation and corrosion. Preferably, a tin layer can be deposited on the soldering pads and the contact terminals before electroplating gold to prevent diffusion of copper atoms and gold atoms. Preferably, a thickness of the tin layer is less than 8 millimeters, and a thickness of the gold layer is less than 3 millimeters.

Step 7: the circuit substrate 20 is separated into a number of individual printed circuit boards.

Figure 6:
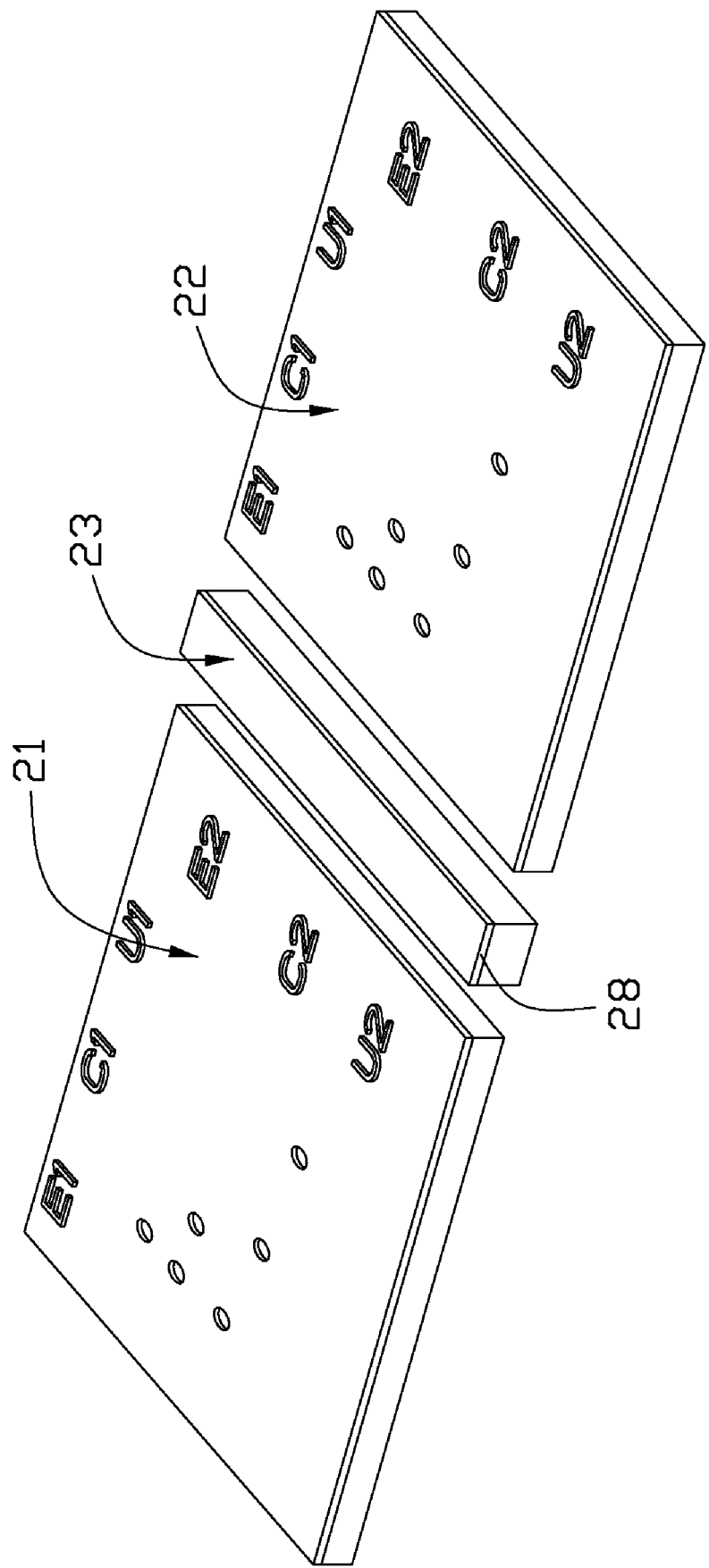
FIG. 6 is a schematic view of the circuit substrate, which is be separated into a number of individual printed circuit boards printed legend thereon.

Because the circuit substrate 20 includes a number of circuit board units corresponding to a number of printed circuit boards, the circuit substrate 20 electroplated with gold can be cut so as to form a number of individual printed circuit boards. Referring to FIG. 6, the circuit substrate 20 is separated into the individual first circuit board unit 21, the individual second portion 22 and the individual connection portion 23. Generally, the connection portion 23 is useless and will be abandoned. In the method, because the legend layer 28 is formed on the metal layer 231 of the connection portion 23, gold will not be deposited on the connection portion 23. Therefore, dosage of an electroplating gold solution can be reduced, and thus cost of manufacturing a number of printed circuit boards can be decreased to a great extent.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope of the appended claims.

What is claimed is:

1. A method for manufacturing a plurality of printed circuit boards, comprising the steps of:
   providing a circuit substrate, the circuit substrate comprising a plurality of circuit board units and a plurality of connection portions interconnected between the neighboring circuit board units;
   providing a legend printing stencil, the legend printing stencil comprising a plurality of printing portions and a plurality of junction portions interconnected between the neighboring printing portions, each of the printing portions defining a plurality of legend holes therein, each of the junction portions defining a slot therein;
   disposing the legend printing stencil on the circuit substrate so that each of the printing portions covers the corresponding circuit board unit and each of the junction portions covers the corresponding connection portion;
   applying a legend ink material on the legend printing stencil and forcing the legend ink material through the legend holes and the slots;
   removing the legend printing stencil from the circuit substrate, thereby a plurality of printing legends being formed on the circuit board units and a legend ink layer being formed on each of the connection portions;
   electroplating the circuit substrate in areas without the printing legends and legend ink layers; and
   separating the circuit substrate into a plurality of individual printed circuit boards and printed connection portions.

2. The method as claimed in claim 1, wherein the legend printing stencil is comprised of a material selected from the group consisting of metal, wood and plastic.

3. The method as claimed in claim 1, wherein a shape of the legend holes is selected from the group consisting of characters, logos, serialization numbers and any combination thereof.

4. The method as claimed in claim 1, wherein the legend ink material is selected from the group consisting of a thermally curable legend ink and an ultraviolet curable legend ink.

5. The method as claimed in claim 1, wherein the legend ink material is applied on the legend printing stencil using a method selected from the group consisting of spraying coating, brushing coating and roller coating.

6. The method as claimed in claim 5, wherein the legend ink material is cured after applying the legend ink material on the legend printing stencil.

7. The method as claimed in claim 1, wherein prior to electroplating the circuit substrate, a tin layer is deposited on the circuit substrate.

8. The method as claimed in claim 7, wherein a thickness of the tin layer is less than 8 millimeters.

9. A method for manufacturing printed circuit boards, comprising the steps of:
   providing a circuit board perform, the circuit board preform comprising a plurality of circuit board units and a plurality of connection portions interconnected between the neighboring circuit board units, each of the circuit board units comprising a circuit pattern formed thereon and a solder resist layer covering the circuit pattern, the solder resist layer comprising a plurality of through holes with portions of the circuit pattern exposed therethrough;
   providing a legend printing stencil, the legend printing stencil comprising a plurality of printing portions and a plurality of junction portions interconnected between the neighboring printing portions, each of the printing portions defining a plurality of legend holes therein for printing legends on the solder resist layer, each of the junction portions defining a slot therein for printing a legend ink layer on the connection portion, the slot extending perpendicularly to a lengthwise direction of the legend printing stencil;
   attaching the printing legend stencil on the circuit board preform in a manner such that each of the printing portions of the legend printing stencil covers the corresponding circuit board unit and each of the junction portions covers the corresponding connection portion;
   applying a legend ink material on the printing legend stencil and forcing the legend ink material through the legend holes and the slots;
   removing the legend printing stencil from the circuit board preform, thereby the printing legends being formed on the circuit board units and the legend ink layer being formed on each of the connection portions;

forming a gold layer on the circuit pattern of each of the circuit board units exposed the through holes using an electroplating process; and separating the circuit board preform into a plurality of individual printed circuit boards and printed connection portions.

10. The method as claimed in claim 9, wherein a shape of the legend holes is selected from the group consisting of characters, logos, serialization numbers and any combination thereof.

11. The method as claimed in claim 9, wherein the legend ink material is selected from the group consisting of a thermally curable legend ink and an ultraviolet curable legend ink.

12. The method as claimed in claim 9, wherein the legend ink material is applied on the legend printing stencil using a method selected from the group consisting of spraying coating, brushing coating and roller coating.

* * * * *